(12) United States Patent
Zinser et al.

(10) Patent No.: US 11,295,911 B2
(45) Date of Patent: Apr. 5, 2022

(54) SAFETY SWITCHING DEVICE WITH RECESSED SETTING COMPONENTS

(71) Applicant: PILZ GMBH & CO. KG, Ostfildern (DE)

(72) Inventors: Christoph Zinser, Ostfildern (DE); Lothar Merz, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 172 days.

(21) Appl. No.: 16/448,865

(22) Filed: Jun. 21, 2019

(65) Prior Publication Data
US 2019/0393005 A1 Dec. 26, 2019

(30) Foreign Application Priority Data
Jun. 25, 2018 (DE) .......................... 102018115243.4

(51) Int. Cl.
*H01H 19/14* (2006.01)
*H05K 1/18* (2006.01)

(52) U.S. Cl.
CPC ............. *H01H 19/14* (2013.01); *H05K 1/182* (2013.01); *H05K 2201/10053* (2013.01)

(58) Field of Classification Search
CPC .......... H05K 1/18; H05K 1/181; H05K 1/182; H05K 1/183; H05K 3/3421; H05K 2201/10053; H05K 2201/10196; H01H 19/10; H01H 19/14; H01H 71/74
See application file for complete search history.

(56) References Cited

U.S. PATENT DOCUMENTS

| 10,394,211 B2 * | 8/2019 | Godau .................. H01L 25/162 |
| 2003/0030330 A1 * | 2/2003 | Pullmann ................. G05B 9/03 307/328 |
| 2005/0205282 A1 | 9/2005 | Toyoda et al. |
| 2006/0077613 A1 * | 4/2006 | Hornung ............. H01H 47/004 361/118 |
| 2006/0082558 A1 | 4/2006 | Chen et al. |
| 2018/0175604 A1 * | 6/2018 | Pullmann ............... H01H 50/64 |

FOREIGN PATENT DOCUMENTS

| DE | 4431520 A1 | 3/1996 | |
| DE | 19626129 A1 | 1/1998 | |
| DE | 20 2008 001 280 U1 | 3/2008 | |
| DE | 102015104211 A1 * | 9/2016 | ......... H03K 19/0075 |
| FR | 2 880 512 A1 | 7/2006 | |
| WO | WO-2017199962 A1 * | 11/2017 | ............... H01H 1/44 |

OTHER PUBLICATIONS

Pilz GmbH & Co. KG: Safety relays PNOZ s4—Operating Manual 21396-EN-14; Sep. 2015; 36 pp.

* cited by examiner

*Primary Examiner* — Matthew V Nguyen
(74) *Attorney, Agent, or Firm* — Miller Johnson (57) ABSTRACT

A safety switching device for controlling a load having at least one input for receiving an input signal and one output for outputting an output signal, and having an electrical circuit which provides the output signal as a function of the input signal. The electrical circuit is arranged on a printed circuit board and is coupled to at least one setting component for setting an operating parameter of the safety switching device. The surface of the printed circuit board defines a mounting plane, and the at least one setting component has an adjusting element in a housing and is arranged recessed on the printed circuit board so that the housing of the adjusting element intersects the mounting plane.

15 Claims, 8 Drawing Sheets

SAFETY SWITCHING DEVICE WITH RECESSED SETTING COMPONENTS

CROSS-REFERENCE TO RELATED APPLICATION

This application claims priority from German patent application DE 10 2018 115 243.4 filed on Jun. 25, 2018. The entire content of the priority application is incorporated herein by reference.

BACKGROUND OF THE INVENTION

The present disclosure relates to a safety switching device for controlling a load, in particular for switching the load on and safely off, with at least one input for receiving an input signal and one output for outputting an output signal, and with an electrical circuit which provides the output signal as a function of the input signal. Furthermore, the present disclosure relates to a setting component for adjusting an operating parameter of such a safety switching device as well as a method for manufacturing such a safety switching device.

Safety switching devices of that type are mainly used in the industrial sector to switch electrically driven machines, such as a press or a milling tool, on and safely off. In particular, in conjunction with a safety sensor, for example a mechanically actuated emergency stop button, safety switching devices serve to switch off the machine quickly and safely in an emergency. For this purpose, for example, a machine to be switched off can be connected via working contacts of electromechanical switching elements to a power supply and the switching elements can be actuated by the safety switching device in order to interrupt the power supply of the machine.

Safety switching devices are usually housed in a control cabinet to facilitated central installation and maintenance. Since space in a control cabinet is limited, it is desirable to implement safety switching devices as small as possible in order to be able to accommodate as many functions as possible in as little space as possible. Increasingly, safety switching devices with electronic switching elements, which can do without the usual relays of classic relay technology, are being used for this purpose. By omitting the bulky relays, housing widths of 17.5 mm can be achieved.

By further replacing other mechanical or electromechanical components with electronic equivalents, the housing width can be further reduced. Furthermore, by focusing on purely electronic elements a manufacturing effort can be reduced, especially when it is possible to limit oneself to a single manufacturing process in the manufacture of the electronics, such as surface-mounting technology. It is thus desirable to implement safety switching devices having circuits purely made of electronic components, in particular SMD components.

However, some electromechanical elements commonly used in safety switching devices are difficult or impossible to replace by purely electronic elements. These elements are either not available, do not provide the necessary stability, or are not suitable for use in safety switching devices from a safety perspective.

SUMMARY OF THE INVENTION

It is an object of the present disclosure to provide an improved safety switching device. In particular, it is an object to specify a safety switching device with a smaller size, in particular with a smaller housing width, which allows a comparable safety and stability as convention-al safety switching devices. Furthermore, it is an object to provide a safety switching device that can be produced with less manufacturing effort According to an aspect of the present disclosure, there is provided a safety switching device of the above-mentioned type, wherein the electrical circuit is arranged on a printed circuit board and is coupled to at least one setting component for adjusting an operating parameter of the safety switching device, wherein further a surface of the printed circuit board defines a mounting plane, and wherein the at least one setting component comprises an adjusting element arranged in a housing, which is arranged recessed on the printed circuit board so that the housing of the adjusting element intersects the mounting plane.

According to another aspect of the present disclosure, there is provided a method for manufacturing a safety switching device with the steps:

Providing a printed circuit board having at least one surface defining a mounting plane for arranging an electrical circuit;

Providing a setting component for adjusting an operating parameter of the safety switching device, the setting component being coupled to the electrical circuit and comprising an adjusting element disposed in a housing;

Arranging the electrical circuit and the setting component, wherein the electrical circuit is arranged on the surface of the printed circuit board, and the setting component is arranged recessed on the printed circuit board so that the housing of the adjusting element intersects the mounting plane.

According to yet another aspect of the present disclosure, there is provided a setting component for adjusting an operating parameter of a safety switching device, comprising an adjusting element arranged in a housing, an actuator for adjusting the adjusting element, as well as a contact element projecting from the housing for electrically connecting the adjusting element to an electrical circuit of the safety switching device, wherein the housing defines a body with a front side, a rear side opposite the front side and circumferential side faces which space apart the front and rear sides from one another, and wherein the contact element is configured to make contact with at least one of the circumferential side faces at one end and form a terminal surface at an opposite end, the terminal surface making contact with the mounting plane which intersects the front and rear sides of the housing, when the setting component is mounted as intended.

It is therefore an idea of the present disclosure to arrange at least one setting component of the electrical circuit of the safety switching device recessed on a printed circuit board. Recessed means here that a housing of the setting component intersects a mounting plane defined by the surface of the printed circuit board. Accordingly, the component is not arranged on the surface as usual, but is arranged recessed into a hole-like recess in the surface. The lower edge of the setting component may no longer be located above the printed circuit board, but can form the lower edge of the overall structure of the electrical circuit.

In this way, the overall height of the electrical circuit can be reduced, even if the application requires the use of larger electromechanical components in order to allow the usual stability and reliability. Due to the recessed assembly and the corresponding reduced installation height, a housing width can be reduced by 10% to 15%, making a preferred housing width of 12.5 mm possible.

The recessed assembly further also allows pressure forces to be absorbed, when the adjustment component is actuated, which increases stability and reliability.

Furthermore, proven and tested setting components for safety switching device can be reused, while at the same time the housing width can be reduced. By reusing proven and tested setting components, production costs can be saved. At the same time, the effort for inspection and acceptance testing, which is compulsory for safety devices, can be reduced for new devices, since internal tests or tests accompanying the development can be omitted.

In a preferred refinement, the setting component is an adjusting potentiometer or trimming potentiometer and the adjusting element has in particular an electrical resistance component whose resistance value can be changed mechanically by turning or shifting.

Common adjusting potentiometer, which have sufficient positioning accuracy and sufficient mechanical durability, have an overall height of approx. 10 mm. Therefore, with common safety switching devices, the overall height of the adjusting potentiometers decisively determines the height of the overall structure of the electrical circuits. In order to reduce further the overall height, the proven adjusting potentiometers would therefore have to be replaced by smaller components. However, these are either not available at all or do not have the necessary stability to withstand the mechanical stresses during operation. The recessed assembly of setting potentiometers thus contributes to reducing the overall height of a safety switching device, while maintaining the proven positioning accuracy and stability.

In a further refinement, the adjusting element comprises an actuator with an axis which defines a rotational axis extending parallel to the mounting plane and perpendicular to a front side of the housing of the actuator, wherein the mounting plane intersecting the front side.

In this refinement, the actuator is thus a rotary potentiometer with a shaft that can be used to adjust the adjusting element. With common standard rotary potentiometers, the adjusting element is arranged in a round or cuboid housing from which the shaft protrudes centrally for adjustment. This design enables the greatest possible positioning accuracy and stability of the setting component on the smallest possible surface area. Due to the recessed assembly, it is possible for the shaft to be located directly above or to rest on the surface of the printed circuit board, while a standard adjusting element can be used, in which the shaft emerges centrally from the housing of the adjusting element. With this refinement, standard components for the adjusting element can be used while reducing the overall height. This can have a positive effect on the manufacturing costs.

In a preferred refinement, the housing of the adjusting element has a rear side opposite the front side, which at least partially abuts against the printed circuit board in order to transfer a pressure load onto the printed circuit board, when the actuator is operated.

In this refinement, the adjusting element is at least partially in contact with the printed circuit board on a rear side. In this way, pressure forces, which act on the adjusting element, when the adjusting element is positioned or mounted, can be transferred onto the printed circuit board. This can increase the stability and simplify the assembly process.

In a further refinement, the front side also abuts at least partially against the printed circuit board in order to transfer a tensile load onto the printed circuit board when the actuator is operated.

In this refinement, the housing of the adjusting element is fixed by the printed circuit board in at least two opposite directions. In this way, in particular "blurring", i.e. displacement during assembly, can be effectively counteracted. The assembly can be further simplified in this way.

In a further refinement, the printed circuit board has a cutout through which the housing of the adjusting element can be inserted.

In this refinement, the printed circuit board thus has a hole-like recess into which the housing of the adjusting element can be inserted. The recess can be made particularly easily by milling out the printed circuit board. Thereby, support of the setting component can be improved and air circulation around the setting component can be increased.

In a further refinement, the setting component has at least one contact element, which contacts the electrical circuit on the surface.

In this refinement, the recessed setting component is electrically connected to the rest of the circuit via a contact element on the surface of the printed circuit board. The contact element may be a connection pin, which protrudes from the housing as with wired components, but which is bent here to allow contacting the electrical circuit on a common surface. The other components can be designed in SMD technology. The refinement allows the recessed component also to be assembled and soldered like a conventional SMD component using surface-mounting technology. Thereby, the need for an additional wave soldering process can be eliminated and production can be switched to a single mounting technology. This refinement thus contributes further to a reduced manufacturing effort.

In a preferred refinement, at least one contact element contacts the housing of the actuator at a distance from the mounting plane.

In this refinement, the contact at the housing of the adjusting element is therefore not made on the mounting plane level, but rather on one of the side faces of the adjusting element's housing offset from the mounting plane by the recessed assembly. Thereby, use of common single wired adjusting element is possible, wherein only the pins, which are normally inserted through the PCB, are bent up to use surface-mounting technology. As already mentioned, the recessed assembly can be realized particularly cost-effectively with the use of standard elements.

In a further refinement, the safety switching device has a housing with a first and a second side face which each run parallel to the mounting plane, and wherein the housing of the adjusting element is arranged centrally between the first and second side face.

In this refinement, the housing width of the safety switching device is defined by two side faces, with the adjusting element arranged centrally between the housing sides. With the central arrangement, a large number of safety switching devices can be arranged next to each other, while the assignment of the setting components to a safety switching device is better visible to the operator than with an off-center arrangement of the same. Configuration errors due to an incorrect assignment can thus be easily avoided.

The housing of the adjusting element can be arranged at an equal distance from the first side face and the second side face and the housing abuts against the first and second side faces. Thereby, conventional adjusting elements can be used, which have a round or cuboid housing from which a control component, such as a shaft, protrudes centrally. With this refinement, proven standard components can be reused for the recessed assembly.

Alternatively, the first side face and/or the second side face may have a recess in or through which the housing of the adjusting element extends. In this way, the minimum housing width can be further reduced to the height of the adjusting element. At the same time, such recess further fixes and stabilizes the actuator.

It will be understood that the features of the invention mentioned above and those yet to be explained below can be used not only in the respective combination indicated, but also in other combinations or in isolation, without leaving the scope of the present invention.

BRIEF DESCRIPTION OF THE DRAWINGS

Exemplary embodiments of the invention are explained in more detail in the following description and are represented in the drawings, in which.

DETAILED DESCRIPTION OF THE PREFERRED EMBODIMENTS

In the following, the figures are explained in detail. The same reference signs denote the same parts in all drawings and are not explained in detail for each figure.

Figure 1:
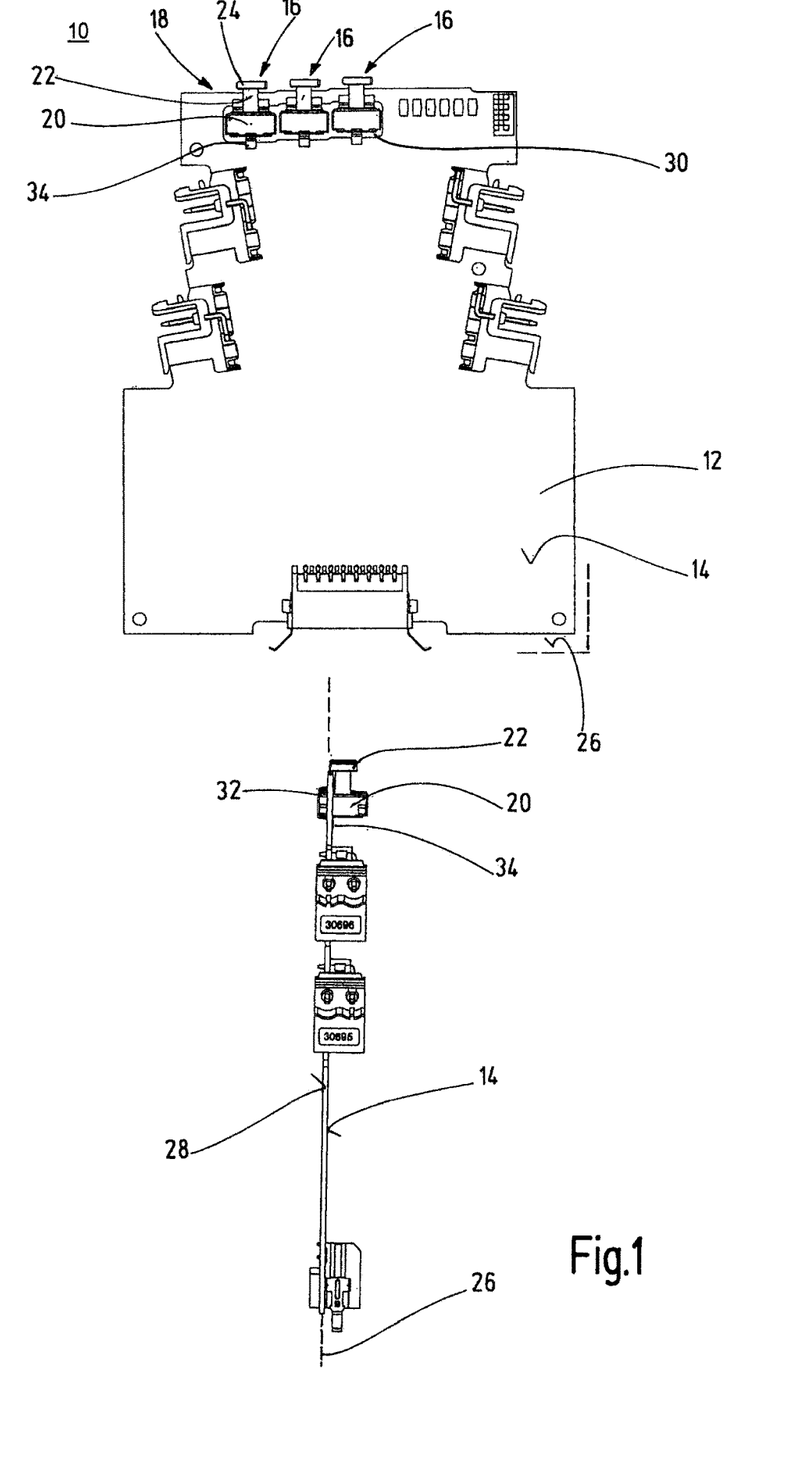
FIG. 1 shows a top view and a side view of a safety switching device according to an embodiment of the present invention without an enclosing housing.

FIG. 1 shows a top view and a side view of a safety switching device according to an embodiment of this disclosure without an enclosing housing. In FIG. 1, the safety switching device according to an embodiment of the present disclosure is denoted in its entirety with the reference numeral 10.

The safety switching device comprises a printed circuit board 12, on whose surface 14 an electrical circuit is arranged. The electrical circuit performs the safety related function, i.e. for example, the switching on and safely off of the load, which is not described here in detail. The electrical circuit contains the elements essential for controlling a load and may in particular comprise one or more circuits including an evaluation unit, input and output circuits and several switching elements.

The electrical circuit can be realized in SMD technology, i.e. it essentially comprises SMD components, which are arranged on the surface 14 of the printed circuit board 12 by means of surface mounting. In contrast to through-hole technology (THT) components, SMD components do not have wire connections, but are soldered directly to the surface 14 of the printed circuit board 12 by means of solderable connection surfaces. During surface mounting, the components, their terminals and their connections are thus arranged on the same surface 14 of the printed circuit board 12.

For conventional safety switching devices, push-through mounting and surface mounting can and are often carried out one after the other in order to equip a printed circuit board of the safety switching device fully. Thus, two process steps are usually required to equip the printed circuit board. In order to reduce the manufacturing effort, it can be desirable to use only one mounting technology. Due to the reduced size achievable, this can in particular be surface mounting with SMD components. Therefore, the entire electrical circuit can be made of SMD components.

An exception to this are the components for setting the operating parameters of the safety switching device, as these are usually operated manually and are therefore intended to be exposed to mechanical stress. For this reason, such setting components are usually provided as wired components in safety switching devices, since through-hole mounting, i.e. inserting the wiring into the printed circuit board, offers additional mechanical stability. In addition to mechanical stability, mechanical precision is also important for setting components. For a setting component to be used to set an operating parameter for a safety switching device, it must be possible to set each individual state precisely, for example, by means of an appropriate rasterization. The structure of a setting component is therefore linked to certain prerequisites, which define a minimum size of the setting component. A minimum construction height of 10 mm has been established for robust setting components that are permissible for safety-related applications. With conventional mounting, a minimum achievable housing width of approx. 17.5 mm can be achieved.

According to this disclosure, an alternative assembly of such setting components is proposed, which allows a smaller housing width with constant or even increased stability.

In FIG. 1, three setting components for setting an operating parameter are shown, each denoted with reference numeral 16. In this exemplary embodiment, the setting components 16 are rotary potentiometers or rotary switches, which can be used to set a defined number of operating states of the safety switching device. A mechanical rasterization can be specified for this, which enables precise positioning or position retention of the rotary elements.

Each of the setting components 16 comprises an actuator 18 and an adjusting element 20. The actuator 18 can be moved by the user for adjustment and the adjusting element 20 converts the adjustment movement into an actuating variable, in particular an electrical actuating variable.

The actuator 18 can be an axis 22 with a rotary plate 24, which is coupled to the adjusting element 20. The adjusting element 20 can be an electrical resistance component whose resistance values can be changed mechanically by moving the actuator 18.

The adjusting element 20 of the safety switching device according to this disclosure is recessed to a mounting plane 26 of the electrical circuit. The mounting plane 26 of the electrical circuit is defined by the surface 14 of the printed circuit board 12. Recessed in this context means that a housing of the adjusting element 20 intersects the mounting plane 26 and thus, for example, the housing partially protrudes from the rear side 28 of the printed circuit board 12. The rear side 28 is the side opposite of the surface 14.

The printed circuit board 12 can have one or more cutouts 30 for the recessed assembly, through which the adjusting element 20 is inserted. The size of the adjusting element 20 can therefore remain unchanged compared to adjusting elements in conventional safety switching devices, but a height of the overall structure can be reduced, since the adjusting element 20 is not mounted above the surface 14 of the printed circuit board 12, but rather enclosed by the printed circuit board 12. While retaining the original size and mechanical properties of the adjusting element 20, a reduction of the overall housing width of the safety switching device can be achieved.

In addition, in a configuration as shown in FIG. 1, the setting components 16 can be contacted on the surface 14 of the printed circuit board 12 that is equipped with the electrical circuit. This is easily achieved by using a conventional "wired" setting component, the wiring of which is bent towards the component body, so that the free ends 34 of the wiring 32 reach the surface 14 of the printed circuit board 12 even in the recessed position. In this configuration, a setting component 16 can be treated like any other SMD component of the remaining electrical circuit.

A recessed setting component 16, whose wiring 32 is designed so that it extends to the surface 14, can thus be mounted and soldered together with the other SMD components by means of normal surface mounting. For this purpose, the free ends 34 of the wiring 32 are also placed on solderable terminal surfaces on the surface 14 and soldered in the same way as the other components of the electrical circuit. In other words, in a preferred configuration, an otherwise normally wired setting component could be treated like a normal SMD component in the assembly process, which reduces the manufacturing effort, especially if a previously required wave soldering process for through-hole assembly can be completely dispensed with.

Figure 2:
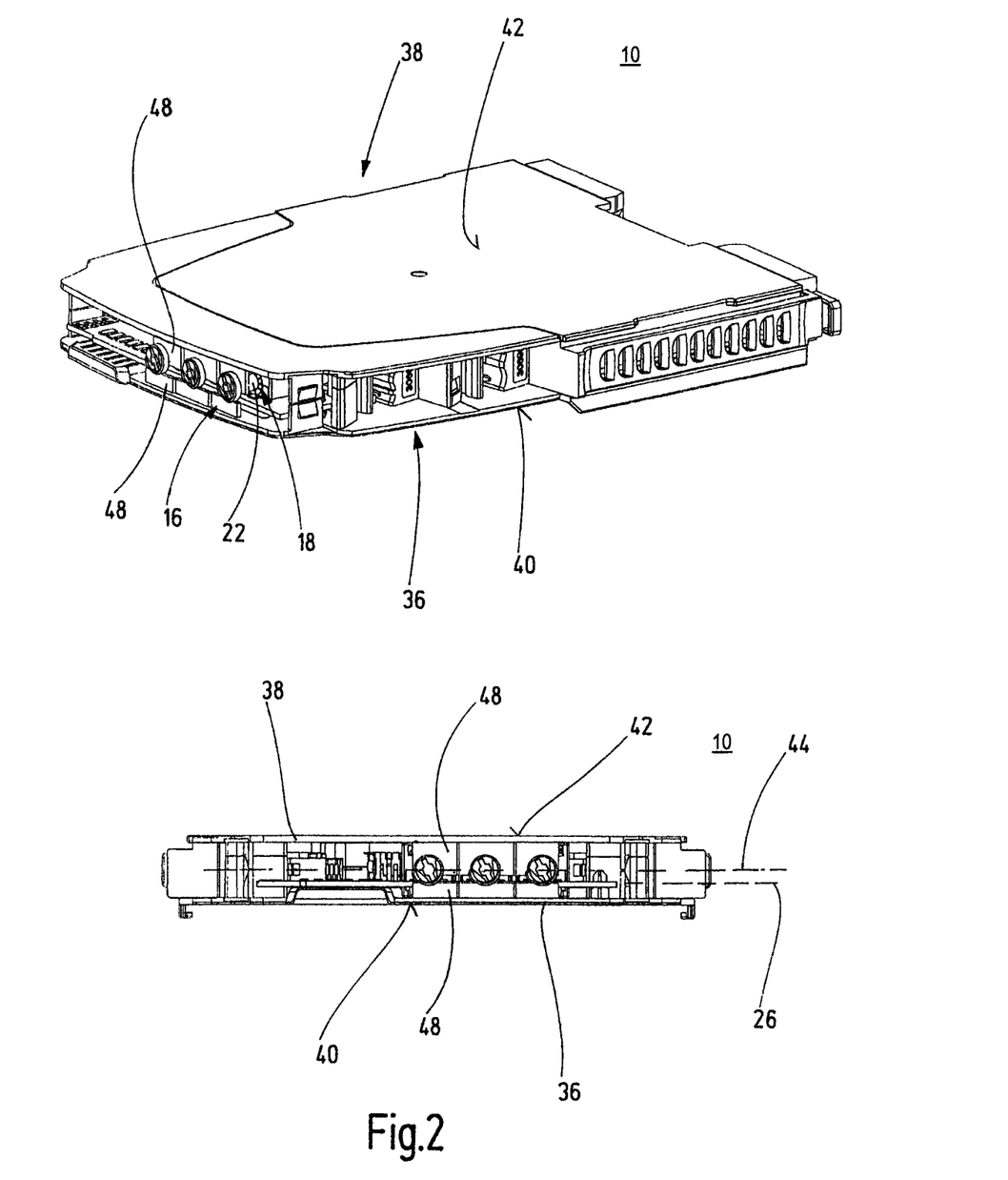
FIG. 2 shows the exemplary embodiment according to FIG. 1 with an enclosing housing.
Figure 3:
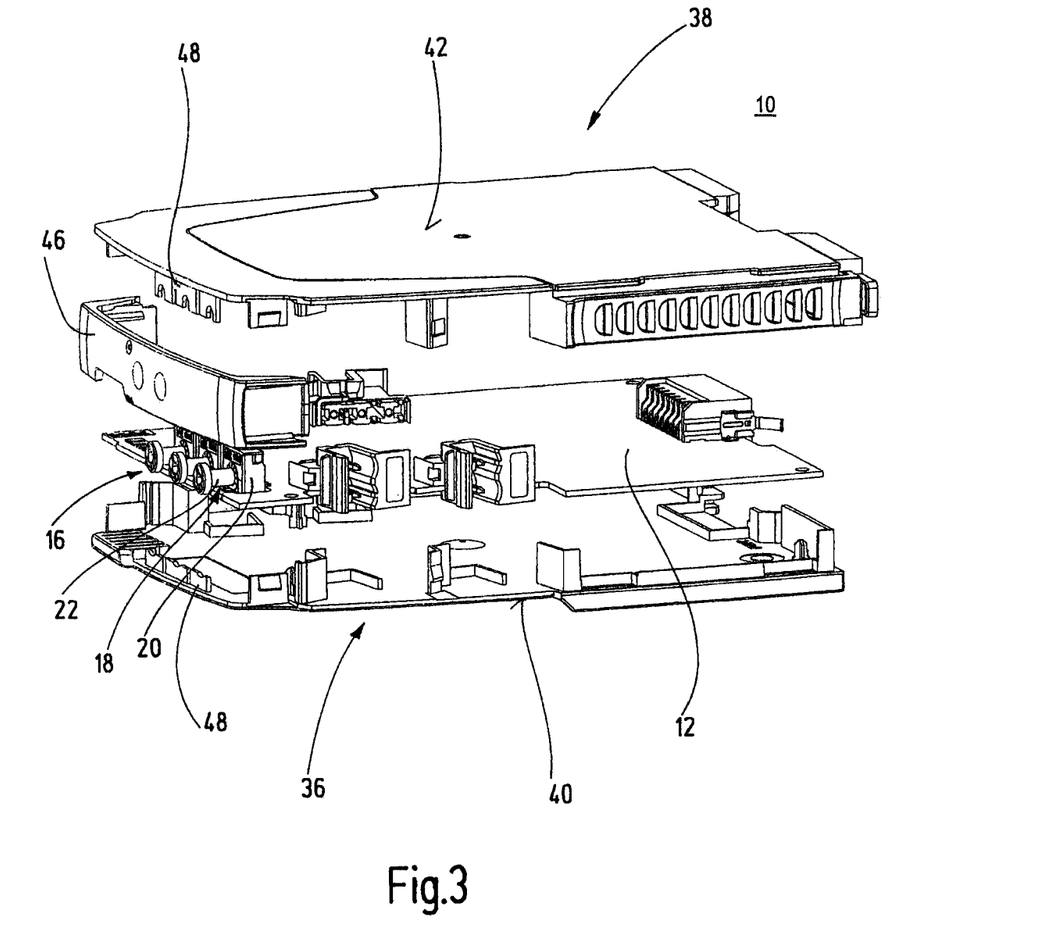
FIG. 3 an exploded view of the safety switching device according to the exemplary embodiment of FIG. 1 and FIG. 2.

FIG. 2 and FIG. 3 show the above-mentioned exemplary embodiment in a perspective view, a frontal view and an exploded view, but in contrast to FIG. 1 each with an enclosing housing. The enclosing housing has a first and a second housing part 36, 38, between which the printed circuit board 12 including the electrical circuit is arranged. The side faces 40, 42 of the two housing parts 36, 38 are essentially parallel to the mounting plane 26 and cover the printed circuit board 12 on both sides.

Due to the predominantly one-sided structure of the electrical circuit, the printed circuit board 12 is normally arranged eccentrically between the housing parts 36, 38, i.e. the mounting plane 26 is at a smaller distance from the first side face 40 than from the second side face 42. An adjustment plane 44, which is defined by the parallel axis 22 of the setting component 16, however, runs centrally to the two side faces 40, 42. With the central alignment of the actuator 18, a large number of safety switching device can be arranged next to each other, while the user can easily assign a setting component 16 to the respective safety switching device and an incorrect assignment due to laterally offset actuators can be avoided.

The axis 22 of the setting components 16 are spatially arranged behind a front panel 46, so that the components can be easily mounted from one direction. The assembly sequence can be as follows: First housing part 36, assembled printed circuit board 12 with setting component 16 including actuator 18 and adjusting element 20, front panel 46, and finally second housing part 38. To avoid damage to the projecting axis 22 during assembly, the axis 22 can be supported on the first housing part 36 during assembly.

Mechanical stops 48 on the first and/or second housing part 36, 38 can also be used to achieve additional stabilization of the actuators 18. The actuators 18 can rest on the mechanical stop of the first housing part 36 during assembly in order to fixate the setting component 16 in the recessed position for assembly.

Figure 4:
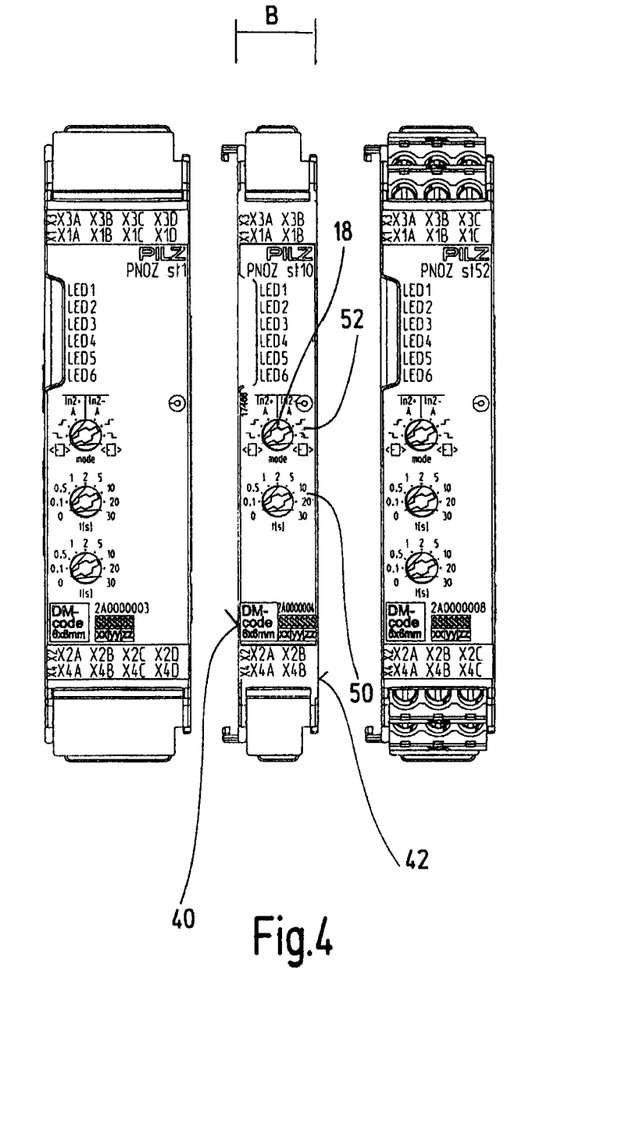
FIG. 4 shows three exemplary embodiments of the present invention each in a frontal view.

FIG. 4 shows in a frontal view an example of three assembled safety switching devices with setting components arranged in accordance with this disclosure. The safety switching device in the middle corresponds to a preferred configuration with a housing width B of 12.5 mm. The central axis of the actuators 18 runs centrally between the two housing sides 40, 42 and a circumferential scale marking 50 or a circumferential arrangement of symbols 52 is possible.

Of course, a printed circuit board assembled according to this disclosure can still be used in wider housings, as show here with the left and right illustration. A printed circuit board assembled according to this disclosure is therefore backwards compatible to old housings, wherein a front panel may have to be replaced.

In wider housings, the lateral alignment of the central axis of the actuators can provide more space for labelling laterally to the actuators.

It is understood that the safety switching device described here are to be understood only as examples and that other embodiments are conceivable in which recessed mounting is used.

Figure 5:
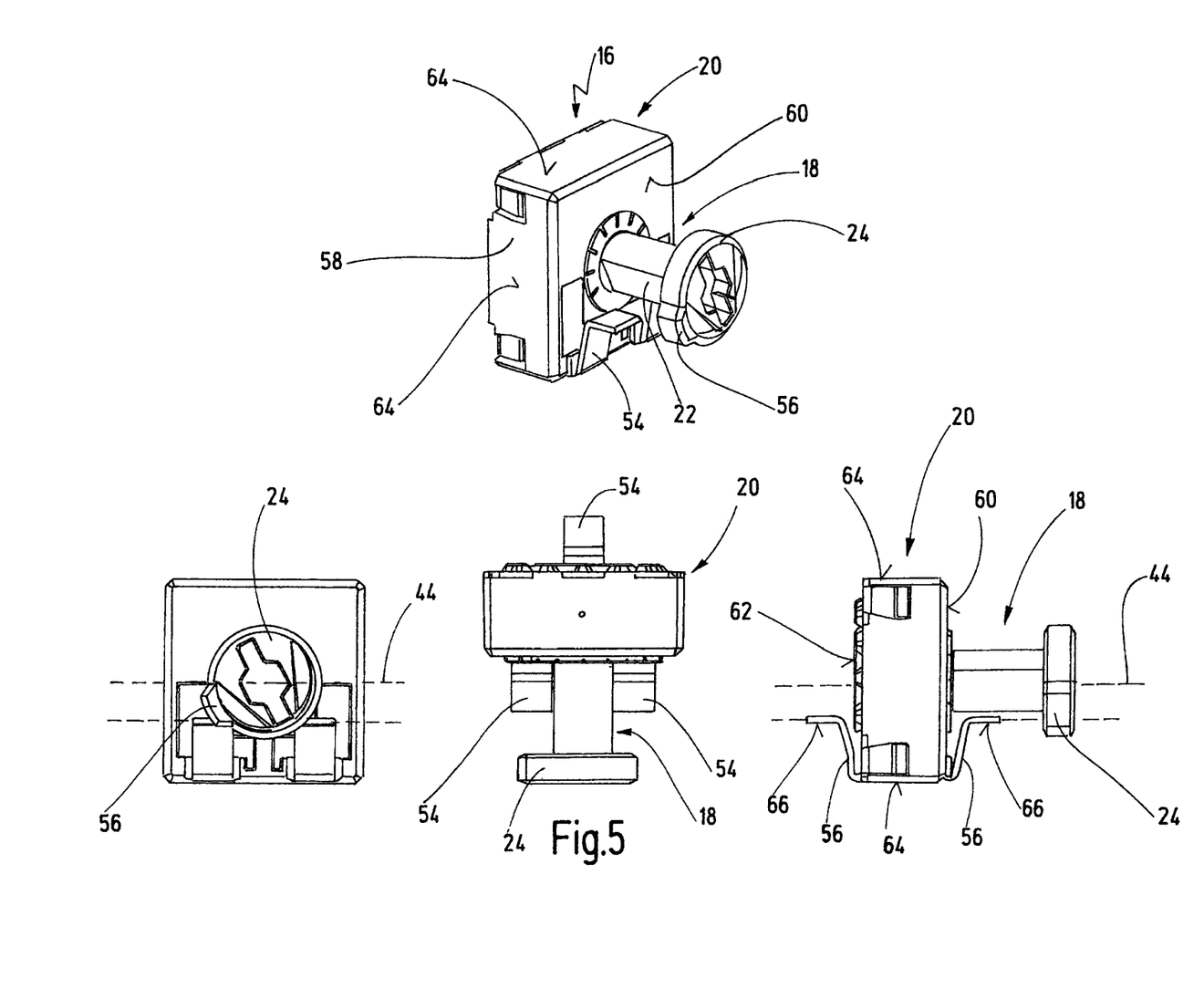
FIG. 5 shows a perspective view, a frontal view, a top view and a side view of an exemplary embodiment of the setting component according to the present invention.

FIG. 5 shows in different views an exemplary embodiment of a setting component 16.

The setting component 16 in this embodiment is a rotary potentiometer with an actuator 18 and an adjusting element 20. The actuator 18 is an axis 22 rotatably mounted on the adjusting element 20 and the adjusting element 20 is an electrical resistance component, the resistance value of which can be changed mechanically by rotating the axis 22.

Rotary potentiometers of this type usually have three connections via which the setting component 16 can be coupled with an electrical circuit. Mainly, a circuit is used as a continuously adjustable voltage divider. The connections are realized in the form of contact elements 54.

The setting component 16 is implemented as an adjustment or trimming potentiometer, which is designed for only a few and usually uncomfortable adjustments, for example to set a limited number of defined operating parameters of a safety switching device once, e.g. during initial setup. For this purpose, the adjusting element 20 has a discrete rasterization, whereby each rest position corresponds to a defined state. The rasterization is designed to hold the actuator 18 in the respective rest position so that a change is only caused by deliberate actuation. This can be achieved, for example, by being able to adjust the axis 22 only by means of a rotary plate 24 arranged on the axis with the aid of a screwdriver. In addition, an overturn protection can be implemented by arranging an additional stop 56 directly on the rotary plate 24 or alternatively on the axis 22, which interacts with a stop located on the housing and prevents overturning of the axis 22.

In particular, for safety switching device it is important that the rasterization and an overturn protection be designed reliably and robustly so that safety is not endangered by a false setting. As already mentioned, a mechanically robust setting component 16 is therefore necessary, which considerably restricts the choice of size or type. Despite these structural limitations, in safety technology, adjusting potentiometers as shown here are preferably used in order to comply with the safety-related specifications.

The adjusting element 20 is arranged in a housing 58 in which a resistance element in the form of a torus is encapsulated. The housing 58 can be rectangular with a front side

60, an opposite rear side of 62 and circumferential side faces 64. The side faces 64 space apart the front and rear side 60, 62 from each other. The axis 22 of the actuator 18 can protrude centrally from the front side 60, as shown here.

According to this disclosure, the setting component 16 is designed to contact an electrical circuit on a mounting plane 26, which intersects a body defined by the housing 58. This means that the electrical circuit is mounted on a plane which intersects the front and rear sides 60, 62 of the housing 58, in particular at a right angle. Thus it is possible that the setting component 16 can be arranged recessed to a mounting plane 26 defined by a printed circuit board 12 as described above.

As shown in FIG. 5, the contact element 54 has contact surfaces 66 on one side, which are designed so that they rest on mounting plane 26 during assembly. In addition, the contact elements 54 are connected to at least one side face of the circumferential side faces 64 in order to contact the electrical resistance component inside the housing 58. Compared to the usual contacting, the adjusting element 20 does not have to be changed, since even with wired potentiometers or SMD potentiometers the contacting is usually carried out on the side faces 64. Therefore, no structural changes need to be made to the adjusting element 20 for a setting component 16 according this disclosure. An adjusting element 20 already approved for safety applications can thus be reused, which simplifies type approval of the device.

A conventional wired setting component can serve as the basis for the manufacture of the setting component 16 in accordance with this disclosure, wherein an existing wiring is bent, in particular subsequently to its manufacture, so that the wiring reaches up to a mounting plane 26 and connection surfaces 66 are formed on one side. Alternatively, the contact element 54 can also be cut to length and shaped using an adapted punching tool in order to achieve the desired contacting of an otherwise unchanged setting component.

A setting component 16 according to this disclosure with pre-assembled axis 22 can be supplied in a belt and directly processed by an SMD placement system. A separate mounting of the axis is thus not necessary. The setting component 16 can be mounted like any other SMD component, so that a wave soldering process normally required for wired setting components can be completely dispensed with.

It is understood that the housing 58 of the adjusting element 20 is not limited to the cuboid shape shown here, but can also be, for example, round in another exemplary embodiment. Furthermore, other contacting methods are conceivable, which allow a recessed assembly.

Figure 6:
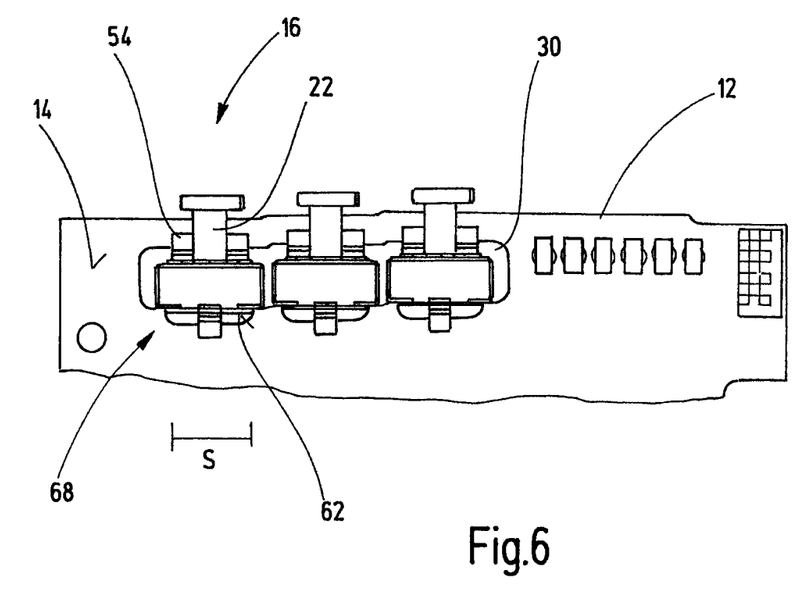
FIG. 6 shows an exemplary embodiment of a printed circuit board according to the present invention having T-shaped cutouts.
Figure 7:
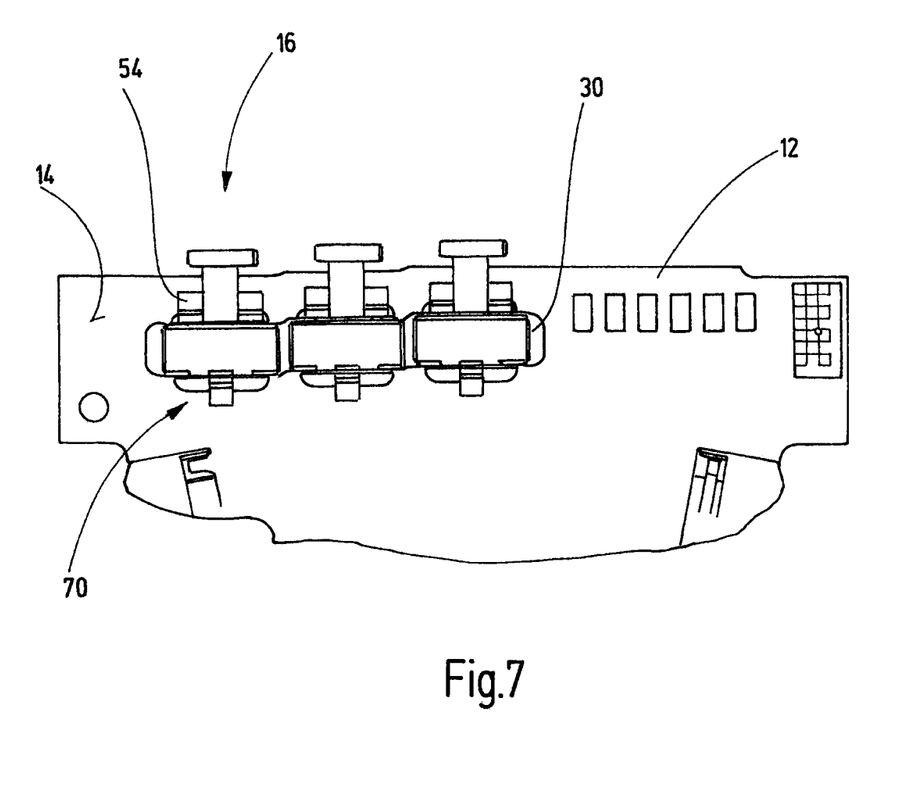
FIG. 7 shows a further exemplary embodiment of a printed circuit board according to the present invention having cross-shaped cutouts.

FIGS. 6 and 7 show two preferred embodiments of printed circuit boards for recessed assembly, especially for the recessed assembly of setting components.

In FIGS. 6 and 7 three setting components 16 of the type described above are each arranged in a shared cutout 30, i.e. the setting components 16 are inserted through the printed circuit board 12 and their contact elements 54 rest on one side of a surface 14 of the printed circuit board 12.

The cutouts 30 differ in FIG. 6 and in FIG. 7 by their contour.

In FIG. 6, the cutout 30 for a single setting component 16 has a T-shaped contour 68, wherein a width S is selected so that the rear side 62 of the setting component 16 at least partially rests against the printed circuit board 12. A pressure load on the setting component 16 along axis 22, which can occur during operating the actuator of the setting component, can be transferred onto the printed circuit board 12 by resting the setting component 16 against the rear side 62. Damage caused by mechanical stress, such as the breaking of wiring, can thus be prevented and the overall stability is increased.

In the exemplary embodiment according to FIG. 7, the cutout 30 for a setting component 16 has a cross-shaped contour 70. In addition to the previous embodiment according to FIG. 6, the front side 60 of the setting component 16 also at least partially rests against the printed circuit board 12. A tensile load along axis 22 can thus also be transferred onto the printed circuit board 12. At the same time, the position fixing on both sides prevents the component from slipping during the assembly process, especially when soldering the contact elements. The embodiment is therefore particularly suitable for surface mounting.

Generally, a cutout 30, regardless of its shape, can increase air circulation around the setting component 16. As a result, the setting component 16, which due to its design must regularly convert a power loss, can dissipate heat better into the environment. The printed circuit board 12 and adjacent components heat up less due to the widely spaced contact elements 54, so that overall a higher possible electrical load on the setting components 16 is possible with given air circulation compared to normal surface mounting or push-through mounting.

Figure 8:
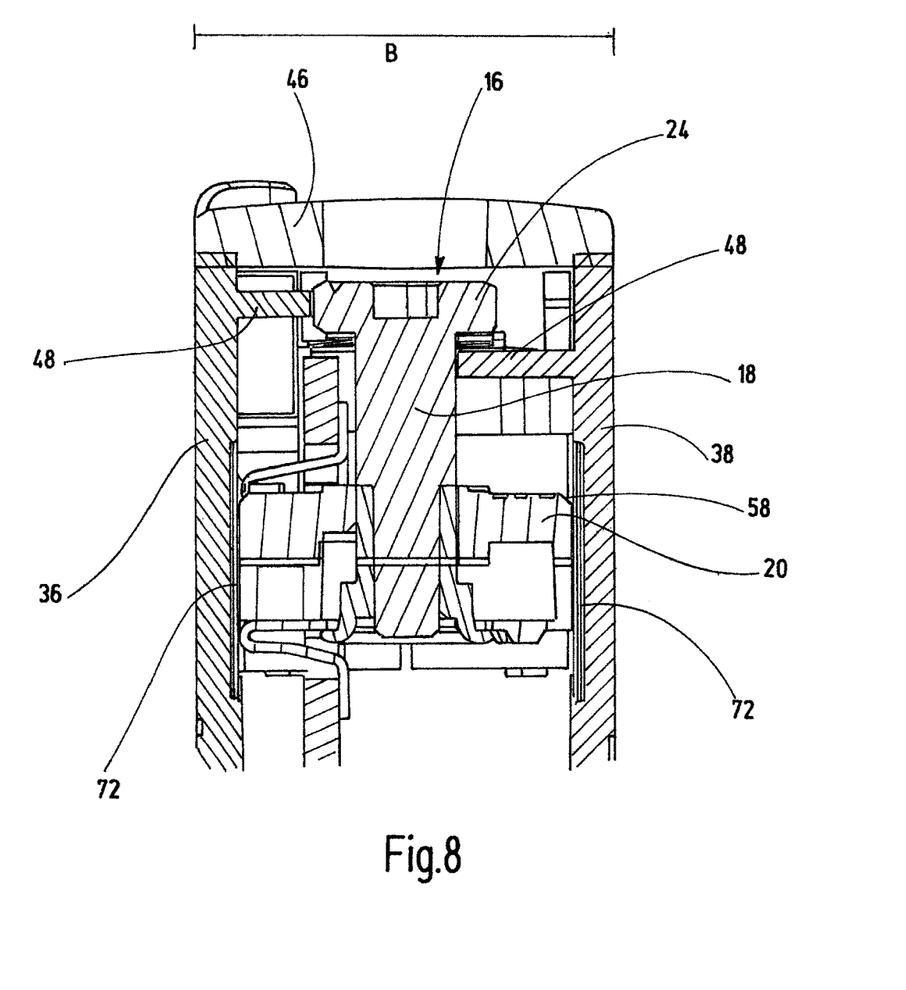
FIG. 8 shows a cross-section of a further exemplary embodiment of the present invention.

Finally, FIG. 8 shows a preferred exemplary embodiment in which a housing width can be further reduced. FIG. 8 shows a cross-section through a preferred exemplary embodiment of a safety switching device and one of the setting components 16. The setting component 16 is placed in the manner described above between a first housing part 36 and a second housing part 38.

The first and second housing parts 36, 38 have each mechanical stops 48, which support the actuator 18. One of the mechanical stops engages the rotary plate 24 and forms together with a stop provided on the rotary plate 24 an overturn protection.

Furthermore, in this configuration for further reduction of the housing width, recesses 72 are provided in the first and second housing parts 36, 38, in which the housing 58 of the adjusting element 20 is fitted. The recesses 72 can be recesses in the housing parts 36, 38 or, in another exemplary embodiment, cutouts in the form of openings through the housing parts 36, 38. Both variants allow a further reduction of the housing width B, since the housing width B is essentially dependent on the overall height of the housing 58 of the adjusting element 20.

The recesses 72 also contribute to a further fixation and stabilization of the adjusting elements 20. Furthermore, openings in the housing parts 36, 38 may additionally improve the air circulation.

It is understood that the individual features of the shown embodiments are not limited to the respective embodiment, but can be combined with features of other embodiments.

Furthermore, the scope of protection of the present invention is not limited by the features explained in the description or shown in the figures, but by the subsequent claims.

What is claimed is:

1. A safety switching device for controlling a load, in particular for switching the load on and safely off, the safety switching device comprising:
   an input configured to receive an input signal;
   an output configured to output an output signal;
   a setting component configured to set an operating parameter of the safety switching device; and
   an electrical circuit that provides the output signal as a function of the input signal, wherein:

the electrical circuit is arranged on a printed circuit board and is coupled to the setting component, a surface of the printed circuit board defines a mounting plane, the setting component has an adjusting element that is arranged in a housing and is arranged recessed on the printed circuit board so that the housing of the adjusting element intersects the mounting plane, the adjusting element comprises an actuator with an axis that defines a rotational axis extending parallel to the mounting plane and perpendicular to a front side of the housing of the actuator, and the mounting plane intersects the front side.

2. The safety switching device of claim 1, wherein the adjusting element includes at least one of an adjusting potentiometer and a trimming potentiometer.

3. The safety switching device of claim 2, wherein the adjusting element includes an electrical resistance component whose resistance value can be changed mechanically by at least one of turning and shifting.

4. The safety switching device of claim 1, wherein:
the housing of the adjusting element has a rear side that is opposite to the front side, and
the rear side at least partially abuts against the printed circuit board in order to transfer a pressure load onto the printed circuit board, when the adjusting element is operated.

5. The safety switching device of claim 1, wherein, when the adjusting element is operated, the front side at least partially abuts against the printed circuit board in order to transmit a tensile load onto the printed circuit board.

6. The safety switching device of claim 1, wherein the printed circuit board has a cutout through which the housing of the adjusting element can be inserted.

7. The safety switching device of claim 1, wherein:
the setting component has at least one contact element, and
the at least one contact element contacts the electrical circuit on the surface.

8. The safety switching device of claim 7, wherein the at least one contact element further contacts the housing of the adjusting element at a distance from the mounting plane.

9. The safety switching device of claim 1, wherein:
the safety switching device has a housing with a first side face and a second side face that each run parallel to the mounting plane, and
the housing of the adjusting element is arranged centrally between the first and second side faces.

10. The safety switching device of claim 9, wherein:
the housing of the adjusting element is arranged at an equal distance from the first side face and the second side faces, and the housing of the adjusting element abuts against the first and second side faces, respectively.

11. The safety switching device of claim 9, wherein the first side face has a recess in or through which the housing of the adjusting element extends.

12. The safety switching device of claim 9, wherein the second side face has a recess in or through which the housing of the adjusting element extends.

13. A setting component for adjusting an operating parameter of a safety switching device, comprising:
an adjusting element arranged in a housing;
an actuator configured to adjust the adjusting element; and
a contact element projecting from the housing and configured to electrically connect the adjusting element to an electrical circuit of the safety switching device,
wherein:
the housing defines a body with a front side, a rear side opposite the front side, and circumferential side faces that space apart the front and rear sides,
the contact element is configured to make contact with at least one of the circumferential side faces at one end and form a terminal surface at an opposite end,
the terminal surface is configured to, when the setting component is mounted as intended, make contact with a mounting plane that intersects the front and rear sides of the housing, and
the actuator has an axis that defines a rotational axis extending parallel to the mounting plane and perpendicular to the front side of the housing.

14. A method for manufacturing a safety switching device comprising:
providing a printed circuit board having at least one surface defining a mounting plane for arranging an electrical circuit;
providing a setting component for adjusting an operating parameter of the safety switching device, the setting component being coupled to the electrical circuit and including an adjusting element disposed in a housing;
arranging the electrical circuit on the surface of the printed circuit board; and
arranging the setting component recessed on the printed circuit board so that the housing of the adjusting element intersects the mounting plane,
wherein the adjusting element includes an actuator with an axis that defines a rotational axis extending parallel to the mounting plane and perpendicular to a front side of the housing of the actuator, and
wherein the mounting plane intersects the front side.

15. The method of claim 14, further comprising:
soldering the electrical circuit and the setting component, wherein only surface-mounting technology is used for the arranging and the soldering.

* * * * *